(12) United States Patent
Ishizaka

(10) Patent No.: US 7,245,794 B2
(45) Date of Patent: Jul. 17, 2007

(54) SURFACE MOUNT MODULE

(75) Inventor: Mitsunori Ishizaka, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 11/101,718

(22) Filed: Apr. 8, 2005

(65) Prior Publication Data

US 2006/0018606 A1     Jan. 26, 2006

(30) Foreign Application Priority Data

Jul. 20, 2004  (JP)  ............................. 2004-210889

(51) Int. Cl.
  *G02B 6/12*  (2006.01)
(52) U.S. Cl. .......................................... 385/14; 385/88
(58) Field of Classification Search ................ 385/14, 385/88
See application file for complete search history.

(56) References Cited

U.S. PATENT DOCUMENTS

| | | | |
|---|---|---|---|
| 3,980,376 A * | 9/1976 | Rosen | 439/327 |
| 4,008,942 A * | 2/1977 | Grossi | 439/328 |
| 4,271,665 A | 6/1981 | Mandrin | |
| 5,104,324 A | 4/1992 | Grabbe et al. | |
| 5,432,630 A * | 7/1995 | Lebby et al. | 398/116 |
| 5,800,200 A * | 9/1998 | Brioaud et al. | 439/404 |
| 5,980,323 A * | 11/1999 | Bricaud et al. | 439/630 |
| 6,222,967 B1 * | 4/2001 | Amano et al. | 385/49 |
| 6,234,686 B1 * | 5/2001 | Tonai et al. | 385/88 |
| 6,315,620 B1 * | 11/2001 | Moir et al. | 439/862 |
| 2002/0154239 A1 | 10/2002 | Fujimoto et al. | |
| 2002/0197015 A1 | 12/2002 | Shaw | |
| 2002/0197025 A1 | 12/2002 | Vaganov et al. | |

FOREIGN PATENT DOCUMENTS

| | | |
|---|---|---|
| DE | 2819418 A1 | 10/1979 |
| DE | 4221017 A1 | 1/1993 |
| JP | 2003-084174 A | 3/2003 |

* cited by examiner

*Primary Examiner*—Ellen E. Kim
(74) *Attorney, Agent, or Firm*—Brinks Hofer Gilson & Lione

(57) ABSTRACT

The present invention provides a surface mount electronic module that is compatible with high-temperature processing in a reflow furnace or the like. This electronic module comprises a housing, an electronic device that comprises a printed circuit board and electronic components electrically connected to the printed circuit board and mounted within the housings, and a lead-frame comprising leads each having an inner end electrically connected to the printed circuit board within the housing and an outer end protruding from the housing. The inner ends of the leads are elastically pressed against said printed circuit board to thereby form an electrical connection with the printed circuit board.

4 Claims, 5 Drawing Sheets

SURFACE MOUNT MODULE

This application claims priority under 35 U.S.C. §119 to Japanese Patent Application No. 2004-210889 filed Jul. 20, 2004, the entire content of which is hereby incorporated by reference.

BACKGROUND OF THE INVENTION

1. Field of the Invention

The present invention relates to a surface mount module used in mobile communications equipment, various sensors and the like.

2. Description of the Background Art

As electronic equipment becomes thinner and more compact, various electronic components mounted therein must be also made thinner and more compact. Consequently, conventional through-hole mount technology is commonly replaced with surface mount technology which permits such electronic components to be made both thinner and more compact.

In contrast, for electronic components used in automobiles, through-hole mount technology is still often used in a variety of types of modules that are adopted for use in-vehicle optical transport systems.

For example, the in-vehicle network standard known as Media Oriented Systems Transport (MOST), which has been adopted mainly in Europe, employs through-hole mount two-core bidirectional fiber-optic modules in which two plastic optical fiber (POF) cores are employed for data communications (e.g., see "MOST Gaiyō [MOST Overview]," Nikkei Electronics No. 741, pp. 108–122, Apr. 19, 1999).

FIG. 8 is a side cross-sectional view of a light-emitting side bidirectional fiber-optic module (optical mini-jack module) constituting a through-hole mount two-core bidirectional fiber-optic module. FIG. 9 is a side cross-sectional view of the light-receiving side bidirectional fiber-optic module (optical mini-jack module).

First, the constitution of the light-receiving side bidirectional fiber-optic module will be described. In FIG. 8, numeral 80 denotes a fiber-optic jack-type plug which is connected to an optical mini-jack module 60; 61 denotes a housing for the optical mini-jack module 60, having an opening 61*a* on its front surface into which the tip of the fiber-optic jack 80 is inserted and connected, the opening being connected at its rear end to a chamber 61*b* formed in the housing; and 62 denotes a light-emitting device disposed within the chamber 61*b* so that it faces the end surface of the fiber-optic jack 80.

Further, numeral 63 denotes a lead-frame of the light-emitting device 62; 64 denotes a light-emitting IC that converts an electrical signal representing logic levels into a signal used to drive the light-emitting device; 65 denotes an LED which is a light-emitting device that converts a modulated electrical signal into an optical signal, with the IC 64 and the LED 65 each being disposed on the lead-frame 63, and wired. Numeral 67 denotes an encapsulating resin that is transparent to visible light, and that is used to encapsulate as a unit the light-emitting IC 64 and LED 65. A portion of the surface of the encapsulating resin 67 facing the end surface of the fiber-optic jack 80 is recessed, and a convex lens 67*a* is also formed as a unit with the resin 67 upon the recessed surface. Each of the leads of the lead-frame 63 has one end that is provided in the interior of the housing 61, with another end 63*a* protruding from the outside wall of the lower surface of the housing 61 to be used as an input/output connector. Hereinbelow, an end of each of the leads of the lead-frame 63 provided within the housing 61 is referred to as an inner end, while the other end of the same lead that protrudes from the outside wall of the lower surface of the housing 61 is referred to as an outer end. Numeral 90 denotes a substrate to which the fiber-optic module is mounted. When the fiber-optic module is mounted, outer ends of the leads are inserted into holes in the substrate 90 and joined to the bottom side of the substrate using a solder 69.

There now follows a description of the constitution of the light-receiving side fiber-optic module shown in FIG. 9. The only difference in constitution from the light-emitting side is that the light-receiving side fiber-optic module has, in place of the light-emitting device 62, a light receptor 72 that comprises a photodiode (PDi), which converts an optical signal to an electrical signal, and an IC that amplifies the logic level of the electrical signal. The remainder of the constitution is identical to that on the light-emitting side, and identical constituent elements are denoted by corresponding names and numerals, and detailed description of such elements is therefore omitted.

The electrical signal input from the outer end 63*a* of the light-emitting device 62 is converted to light by the IC 64 and LED 65. The light emitted by the LED 65 passes through the encapsulating resin 67, is condensed by the convex lens 67*a*, enters the fiber-optic jack 80 and is sent to a communicating party via the optical fiber connected to the jack. On the other hand, an optical signal sent from the communicating party and arriving through the optical fiber enters the light receptor 72 from the fiber-optic jack 80, is condensed by the convex lens 67*a*, passes through the encapsulating resin 67, is input to the IC 74, converted to an electronic signal and output from the outer end 63*a*.

SUMMARY OF THE INVENTION

In a conventional fiber-optic module in which "through-hole mount technology" is adopted, outer ends of a plurality of leads in the lead-frame extending to the outside are inserted into the holes of the mounting substrate and are then joined to the bottom side of the substrate by soldering, thus necessitating a large number of assembly steps to be carried out when forming holes in the mounting substrate and carrying out the soldering.

In contrast, as described above, surface mount technology was developed in response to demands for more compact and thinner electronic equipment, and which requires no holes to be formed in the substrate, and which during mounting allows components to be mounted to one side of the circuit board at as low a height as possible. Using surface mount technology, a mounting substrate is coated in advance with a solder paste, and fiber-optic modules and other electronic modules are placed upon this solder, heated in a reflow furnace or the like to melt the solder and thus secure the electronic modules to the mounting substrate. Accordingly, not only the solder connection portions but the entire electronic module is heated in the reflow furnace. Moreover, responsive to environmental considerations, use of lead-free solder has been required recently. However, such solder melts at a higher temperature than conventional solder. Accordingly, when electronic modules are surface mounted, if the LED, light-emitting IC and other electronic devices and the inner ends of the leads are wired as shown in FIGS. 8 and 9, thermal stresses are induced in these wired portions, making them susceptible to connection faults.

Moreover, the LED, light-emitting IC and other electronic devices are packaged together by means of the same transparent resin, and so when used in an environment that is subject to extreme temperature variations, such as occur in a vehicle, connecting portions between electronic devices and the lead-frame are subject to large thermal stresses. This problem arises not only in the fiber-optic modules described above, but also in other electronic modules including surface mount modules for magnetic, temperature, humidity, ultrasound and pressure sensors, and the like.

The present invention has been made in order to solve the aforementioned problems and has as its object the use of surface mount technology while maintaining highly reliable connections between electronic devices and a lead-frame within an electronic module.

Namely, the present invention provides a surface mount electronic module comprising a housing, an electronic device including a printed circuit board and electronic components electrically connected to the printed circuit board and being mounted within the housing, and a lead-frame comprising leads each having an inner end electrically connected to the printed circuit board in the housing and an outer end protruding from the housing; wherein the inner ends of the leads are elastically pressed against the printed circuit board so that an electrical connection is made with the printed circuit board.

Specifically, the inner ends of the leads of the lead-frame have elastic flexibility so that they can be elastically engaged with the printed circuit board.

The housing may have at least one inner space for receiving the inner ends of the leads of the lead-frame in such a manner that the inner ends can elastically flex and the printed circuit board of the electronic device mounted in the housing may have a portion that is exposed to the inner space, to thereby enable the inner ends of the leads of the lead-frame in the inner space to elastically engage the portion of the printed circuit exposed to the inner space. Specifically, the inner ends of the leads of the lead-frame may be bent toward the printed circuit board such that they are convex in shape.

The outer ends of the leads of the lead-frame may have a first portion extending from the housing, and a second portion extending from the first portion and bent at a right angle, wherein the second portion is joined to a mounting substrate.

Further, the outer ends of the leads of the lead-frame may have a first portion extending from the housing, and a second portion extending from the tip of the first portion, having a stepwise bend and then extending further in the same direction of extension, wherein the second portion is joined to a mounting substrate.

Furthermore, the outer ends of the leads of the lead-frame may have a first portion extending from the housing, a second portion that is in contact with a mounting substrate and electrically connected to the mounting substrate, and a curved third portion that connects the first portion to the second portion, wherein the third portion is able to undergo elastic deformation when the second portion is put in contact with the mounting substrate and pressed in the direction of extension.

The electronic device may be an optoelectronic device.

The housing may further comprise a connector for optical fiber.

With the surface mount technology electronic module according to the present invention, the inner ends of leads of the lead-frame are elastically pressed against the printed circuit board so that an electrical connection is made with the printed circuit board, and thus even when the surface mount electronic module is processed within a high-temperature reflow furnace, electrical connections between the electronic module and lead frame are not subject to excessive heat, whereby a high level of reliability can be maintained.

The above and other objects, features and advantages of the present invention will become more apparent from the following description of the preferred embodiments thereof, taken in conjunction with the accompanying drawings.

BRIEF EXPLANATION OF THE DRAWINGS

FIG. 5(*b*) is a cross-sectional view of the photoreflector mounted in a further manner.

DESCRIPTION OF THE PREFERRED EMBODIMENTS

Figure 1:
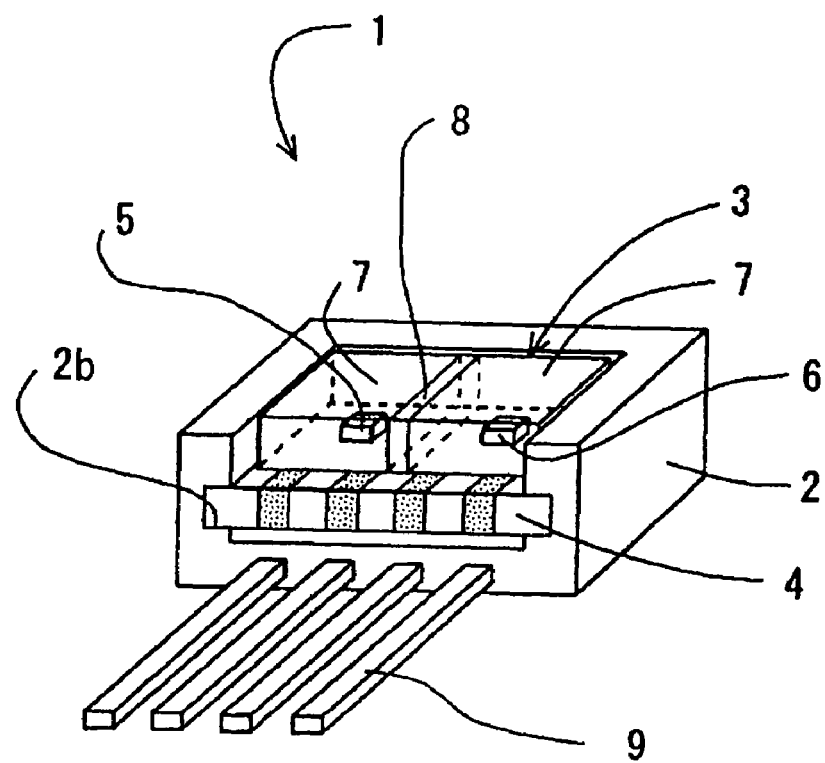
FIG. 1 is a perspective view of a photoreflector in accordance with a first embodiment of the present invention.

First, the constitution of a photoreflector in accordance with a first embodiment of the present invention will be described. In FIG. 1, numeral 1 denotes a photoreflector; 2 a housing, formed from resin, for the photoreflector 1; and 3 a light-receiving/emitting optical device enclosed within the housing 2.

The light-receiving/emitting optical device 3 comprises, for example,: a printed circuit board 4 made of a glass epoxy resin or the like; a light-emitting element 5 and a light-receiving element 6, which are electronic devices mounted to the printed circuit board 4; transparent resin caps 7 that encapsulate the light-emitting element 5 and light-receiving element 6, respectively; and a light-blocking resin 8 provided between the transparent resin caps 7.

Figure 2:
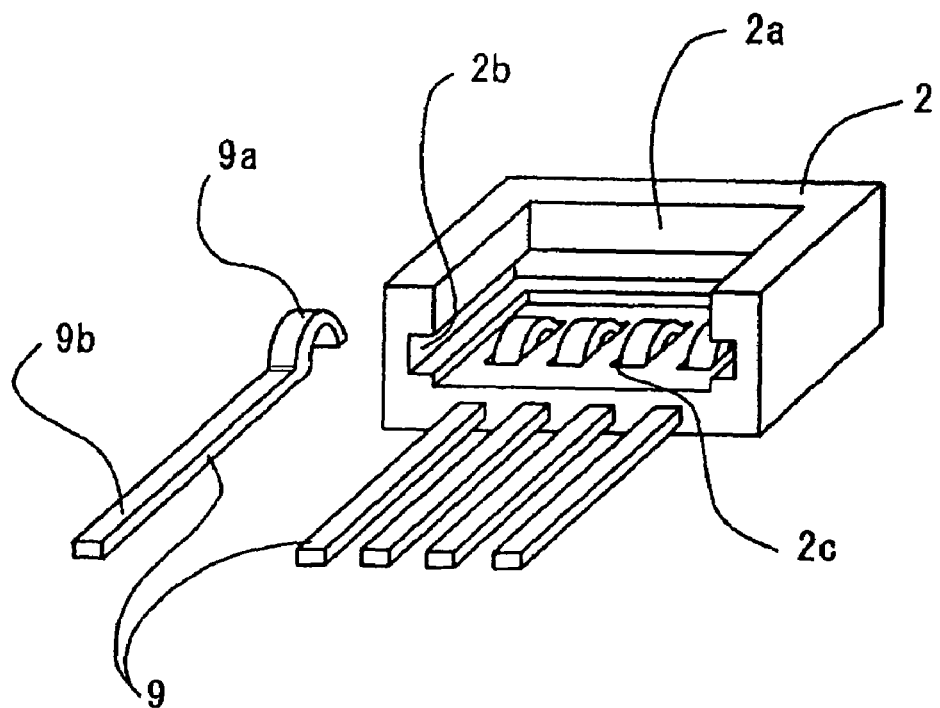
FIG. 2 is a perspective view of a housing of the photoreflector shown in FIG. 1.

In FIG. 2, an indentation 2*a* that accommodates the light-receiving/emitting optical device 3 is formed in the housing 2, and the printed circuit board 4 is fitted into a groove 2*b* formed on the inside surfaces of each side wall of the indentation 2*a*. A plurality of leads 9 in the form of a lead-frame are embedded in the bottom wall of the housing 2, with each lead 9 of the lead-frame having an upwardly bent contact area 9*a* formed on its inner end, and protruding into the indentation 2*a* from an opening 2*c* formed in the bottom wall of the housing. The outer end 9*b* of each of the leads 9 of the lead-frame protrudes from the front surface of the housing 2. The contact area 9a of each of the leads 9 is in elastic contact with the printed circuit board inserted into and held in the groove 2b, to thereby make an electrical connection with the printed circuit board.

Figure 3:
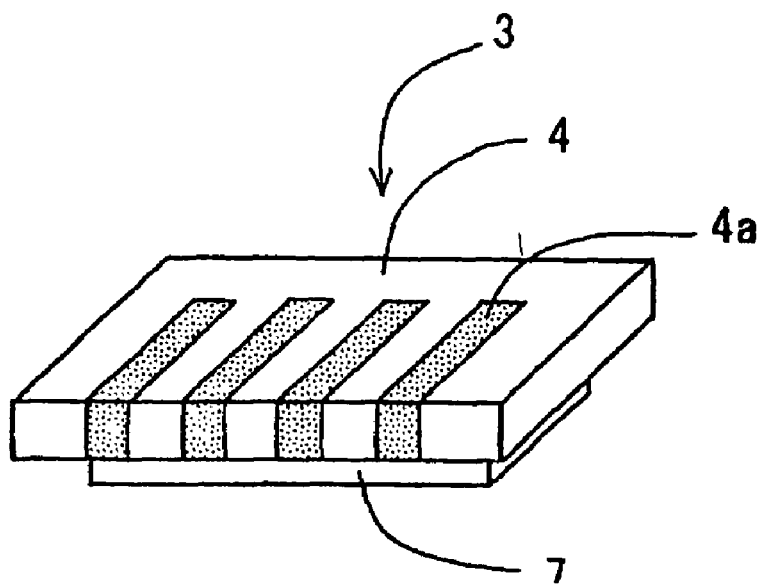
FIG. 3 is a perspective view of an optical device of the photoreflector shown in FIG. 1 when viewed from the bottom surface thereof.

In FIG. 3, a gold-plated wiring pattern 4a is formed on the printed circuit board 4, extending from the upper surface (as seen in FIG. 1) of the printed circuit board 4, on which the light-emitting element 5 and light-receiving element 6 are mounted, around the front surface to the lower surface of the printed circuit board 4. When the light-receiving/emitting optical device 3 is installed within the housing 2, the contact areas 9a of the leads 9 are in contact with the wiring pattern 4a and the light-receiving/emitting optical device 3 is thereby electrically connected to the leads 9.

When the photoreflector 1 is used for detecting an object, a current is applied to the leads 9 of the light-emitting element 5, thus causing the light-emitting element 5 to emit light; and when the emitted light strikes the object, it is reflected and strikes the light-receiving element 6, so that a signal current generated by photoelectric conversion is output from the leads 9 of the light-receiving optical device 3, whereby it is possible to detect the presence of the object.

Figure 4:
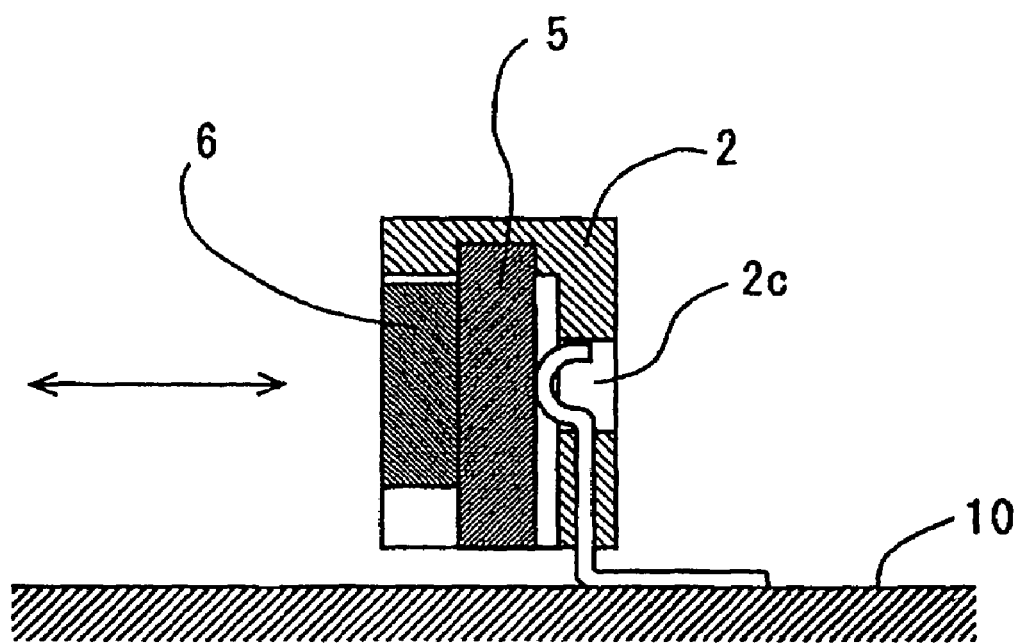
FIG. 4 is a cross-sectional view showing the photoreflector of FIG. 1 in the mounted state.
Figure 5A:
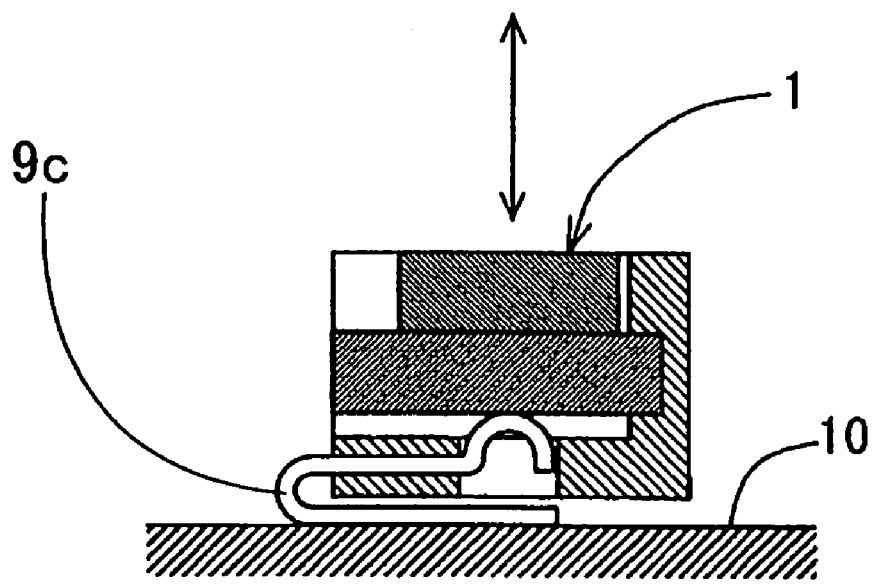
FIG. 5(*a*) is a cross-sectional view of the photoreflector mounted in another manner.
Figure 5B:
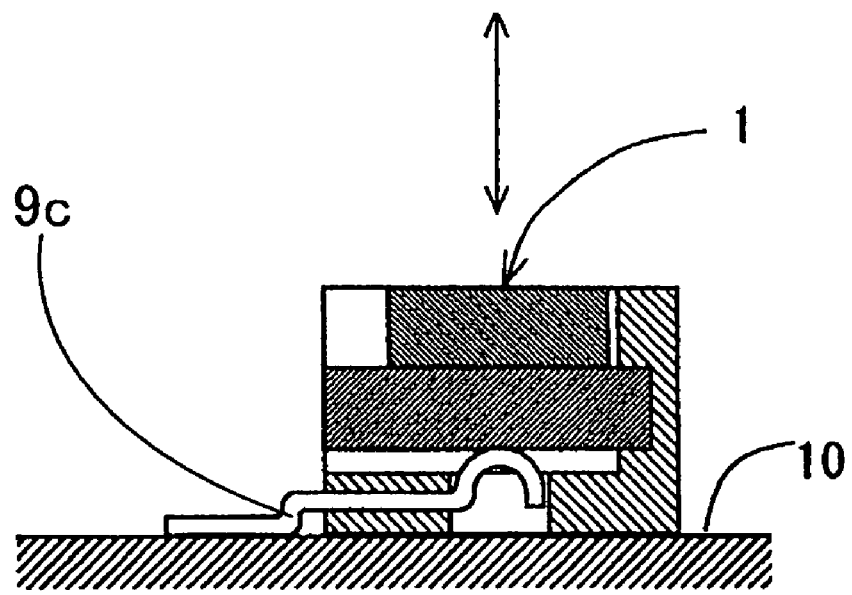

When a photoreflector 1 is to be mounted to a printed circuit board, the portions of the leads 9 protruding from the housing can be bent at a 90 degree angle, as shown in FIG. 4, so that when mounted the photoreflector 1 can receive/emit light in a direction that is parallel to the mounting surface 10. In addition, the portions of the leads 9 protruding from the housing can be bent as shown in FIG. 5 (a) or (b), so that when mounted the photoreflector 1 can receive/emit light in a direction that is perpendicular to the mounting surface 10. Further, the photoreflector may be mounted using the conventional mounting method, without any bending of the straight portions 9b of the leads. In addition, since the photoreflector 1 has the constitution described above, the light-receiving/emitting optical device 3 is removable from the housing 2 so as to enable it to be readily adjusted, replaced, and the like.

Figure 6:
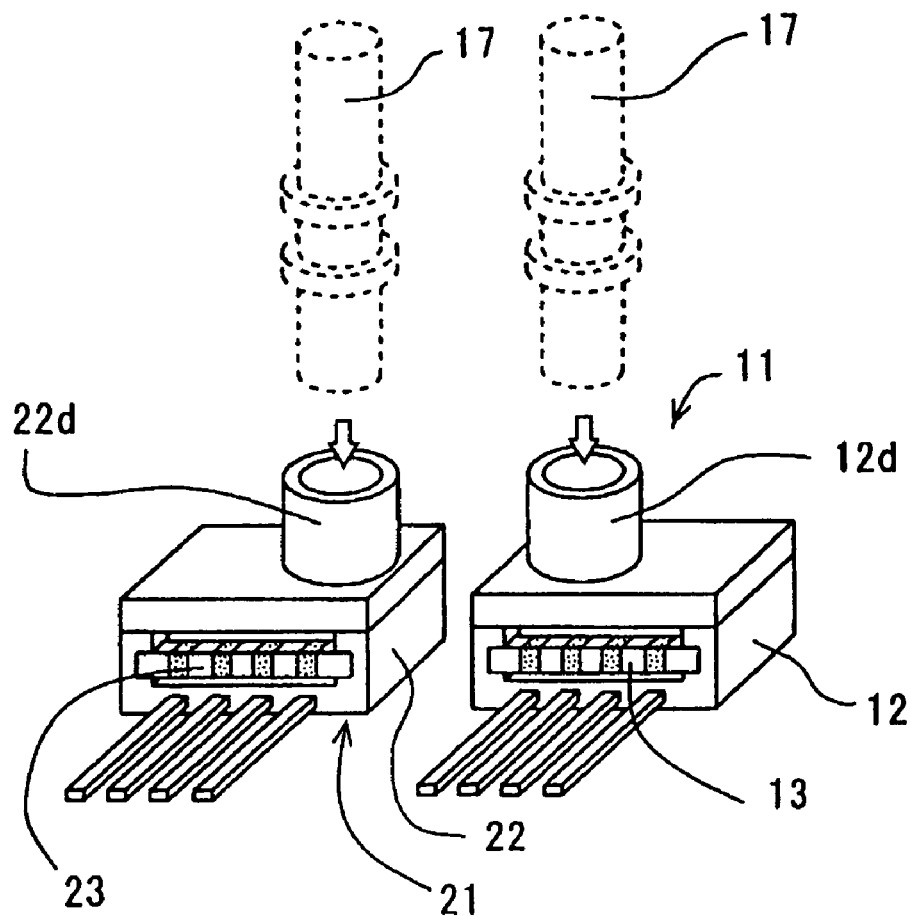
FIG. 6 is a perspective view of a photoreflector in accordance with a second embodiment of the present invention.

Next, the constitution of a fiber-optic module in accordance with a second embodiment of the surface mount module of the present invention will be described. FIG. 6 is a perspective view of the fiber-optic module, wherein the light-receiving module and light-emitting module are formed to constitute separate units. In FIG. 6, numeral 17 denotes optical fibers; 11 a light-receiving fiber module; and 21 a light-emitting fiber module. Numerals 12 and 22 denote respective housings; while 13 and 23 denote a light-receiving device and a light-emitting device, respectively. In contrast to the configuration shown in FIG. 1, the upper openings of the housings 12 and 22 are sealed, and connectors 12d and 22d for attaching optical fiber 17 are formed thereon. The other aspects of the constitution of the invention according to the second embodiment are essentially the same as those of the first embodiment, and detailed description of such aspects is therefore omitted.

Figure 7:
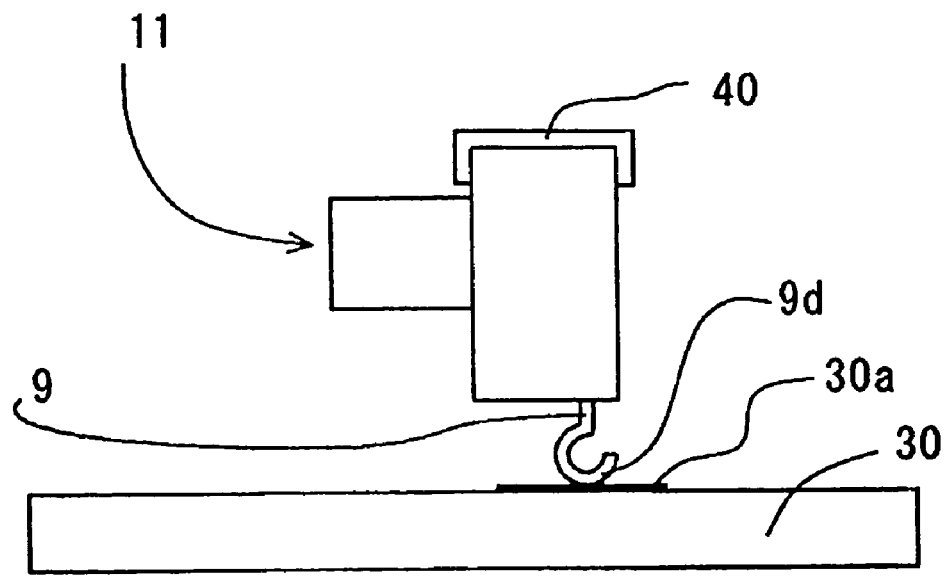
FIG. 7 is a side elevation view of a photoreflector in accordance with a third embodiment of the present invention.
Figure 8:
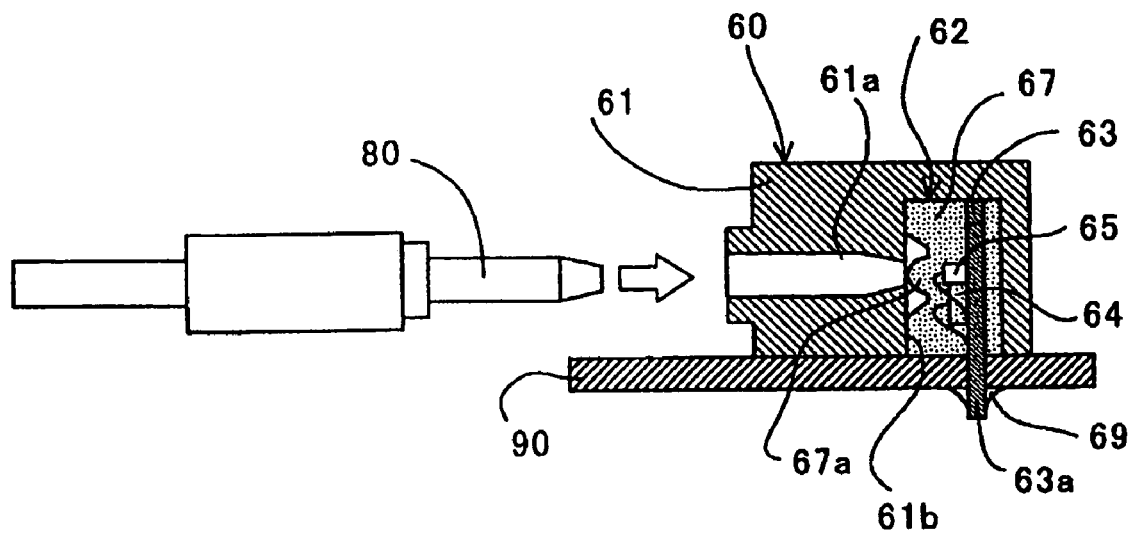
FIG. 8 is a cross-sectional view of the light-emitting side of an optical mini-jack module which is a conventional bidirectional fiber-optic module.
Figure 9:
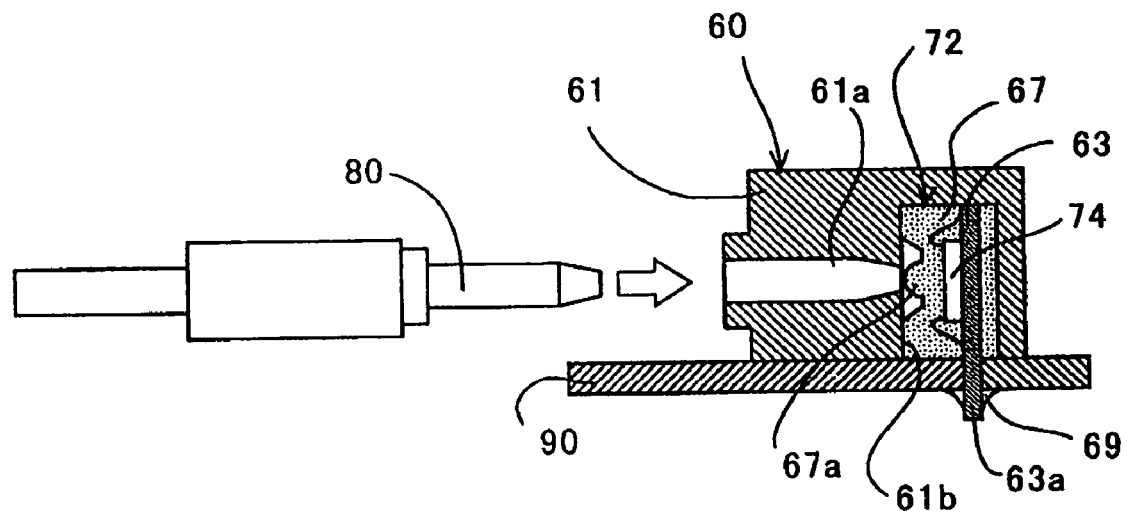
FIG. 9 is a side cross-sectional view of the light-receiving side of an optical mini-jack module which is a conventional bidirectional fiber-optic module.

FIG. 7 is a side view of a fiber-optic module 11 mounted to a mounting substrate 30. In FIG. 7, the portions of the leads 9 protruding from the housing are bent to form a spring contact point 9d. In this mounting, the spring contact point 9d is placed in contact with the wiring pattern 30a of the mounting substrate 30, and the spring contact point 9d is elastically pressed against the wiring pattern or electrode 30a by a holder 40 that holds the fiber-optic module 11.

In this fiber-optic module, the connectors 12d and 22d are disposed in housings 12 and 22, so the optical fiber 17 can be reliably attached thereto. In addition, as shown in FIG. 7, spring contact points 9d are formed on the leads 9, so that upon mounting the spring contact points 9d are pressed against the wiring pattern 30a of the mounting substrate 30, to thereby enable solderless mounting to be achieved. Moreover, since the inner ends of the leads 9 have the same constitution as those shown in the first embodiment, they are able to provide the same effect as that provided in the first embodiment.

It should be understood that the embodiments described above that the present invention is not limited to a photoreflector or fiber-optic module, and may also be applied to an IrDA transceiver, to a photointerruptor or other optical module, as well as to other modules, for example, surface mount modules for magnetic, temperature, humidity, ultrasound and pressure sensors and the like.

The invention claimed is:

1. A surface mount electronic module comprising:
   a housing having a bottom wall, lateral side walls and a rear wall which cooperate to define a space in said housing having a front opening and an upper opening, said lateral side walls comprising inner surfaces opposite each other and elongated grooves formed in said inner surfaces and extending in a fore and back direction of said housing and in parallel with each other, said bottom wall comprising an inner surface defining said space and a plurality of openings formed in said inner surface of said bottom wall which are spaced apart from one another in a lateral direction of said housing;
   a lead-frame comprising elongated leads each having a rear portion embedded in said bottom wall of said housing and a forward portion protruding forwardly from said bottom wall and adapted to be soldered on a mounting substrate for surface-mounting of said electronic module on the mounting substrate, said rear portion having a rear end disposed in a corresponding one of said plurality of openings and convex in shape so that a portion thereof protrudes into said space from said corresponding one of said plurality of openings; and
   an electronic device comprising a printed circuit board having an upper surface, a lower surface, and lateral side edges, and at least one electronic component mounted on said upper surface, said circuit board being fitted in said space in said housing with said lateral side edges of said printed circuit board slidably engaged in said elongated grooves from said front opening of said space of said housing, whereby said rear ends of said leads are elastically pressed by and electrically connected to said printed circuit board.

2. A surface mount module according to claim 1, wherein: said forward portions of said leads of said lead-frame each have:
   a first portion protruding from said bottom wall, and
   a second portion extending from said first portion and bent at a right angle,
   wherein:
   said second portion is mounted to a mounting substrate so that said housing is supported by said first portion extending normal to the mounting substrate such that said upper surface of said bottom surface with said electronic device is directed in a direction parallel to said mounting substrate.

3. A surface mount module according to claim 2, wherein said electronic device is an optoelectronic device.

4. A surface mount module according to claim 3, wherein said housing further comprises an optical fiber connector comprising a wall securely connected to said lateral side walls and said rear wall to close said upper opening of said space, and an optical fiber receiving tube connected to and extending perpendicular to said wall of said connector to receive and hold an optical fiber.

* * * * *